(12) United States Patent
Adler et al.

(10) Patent No.: US 6,510,688 B2
(45) Date of Patent: *Jan. 28, 2003

(54) SAFETY DEVICE FOR A MOVING SYSTEM

(75) Inventors: Erich Adler, Jena (DE); Andreas Berger, Jena (DE); Marlies Mages, Jena (DE)

(73) Assignee: Brooks Automation, Inc., Chelmsford, MA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/158,560

(22) Filed: Sep. 22, 1998

(65) Prior Publication Data
US 2002/0000091 A1 Jan. 3, 2002

(30) Foreign Application Priority Data
Feb. 19, 1998 (DE) .......................... 198 06 852

(51) Int. Cl.⁷ ............................... F15B 15/22
(52) U.S. Cl. ............................ 60/399; 91/421; 91/392; 414/939; 414/940
(58) Field of Search ............... 60/399; 91/421, 91/392; 414/935, 939, 940

(56) References Cited

U.S. PATENT DOCUMENTS

| | | | |
|---|---|---|---|
| 3,895,560 A | * 7/1975 | Anderson | 91/421 |
| 4,840,530 A | * 6/1989 | Nguyen | 414/940 |
| 5,525,024 A | * 6/1996 | Freerks et al. | 414/940 |
| 5,575,372 A | 11/1996 | Huebner et al. | 192/116.5 |
| 5,715,929 A | 2/1998 | Scheler et al. | 198/375 |
| 5,918,526 A | * 7/1999 | Jauhola | 91/336 |

FOREIGN PATENT DOCUMENTS

EP  0 738 559  10/1996

* cited by examiner

Primary Examiner—F. Daniel Lopez
(74) Attorney, Agent, or Firm—Perman & Green, LLP

(57) ABSTRACT

A safety device for a moving system with a drive in which a pneumatically operated piston, by linear movement in a cylinder, moves a transported object past a stationary part in at least one direction has the aim of generating a switching signal at every point of a through-opening when an obstacle is located between the moving object and the edge of the through-opening, regardless of the movement direction of the object and the geometrical construction of the through-opening. The cylinder has, at its ends, devices for measuring the pressure of the air flowing out of the cylinder in the movement direction of the piston, wherein a drop in the otherwise substantially constant pressure below a threshold value serves as a switching signal at least for switching off the system. The device is useful for safety purposes during the transport of objects, particularly when the objects form shearing edges with neighboring objects.

10 Claims, 3 Drawing Sheets

SAFETY DEVICE FOR A MOVING SYSTEM

BACKGROUND OF THE INVENTION a) Field of the Invention

The invention relates to a safety device for a moving system with a drive in which a pneumatically operated piston, by linear movement in a cylinder, moves a transported object past a stationary part in at least one direction.

b) Description of the Related Art

In the fabrication of integrated circuits, because of cleanroom b requirements the substrates to be machined are usually accommodated in pods or transport containers which are transported between different machining steps to the individual stations. Loading and unloading in the stations takes place primarily via closable openings or locks. Due to the fact that the edges or walls of the openings past which the transport containers are moved present hazards for the operating personnel, steps must be taken to prevent the risk of injury. Usually, safety devices are employed which stop all transporting movements and possibly initiate a reversal of the movement when a hazardous situation occurs.

While known light curtains or light barriers provide protection around permissible openings to prevent engagement therein, these safety measures must be switched off during the period in which moving objects pass through. Otherwise, an interruption of movement would result. It is disadvantageous that the protective function is canceled during this through-period.

U.S. Pat. No. 5,575,372 discloses a device of the type mentioned above when two parts moving past one another approach each other, wherein a safety yoke is fastened to one of the parts and is displaceable relative to the part. The safety yoke contains electrically conducting connection elements which connect printed circuits on the part in a reference position of the safety yoke to produce a closed circuit. If an object is pushed against the yoke, a switching signal is generated by the interruption of the circuit so that the forward movement is terminated. It is disadvantageous that the yoke always acts in only one direction. In order to provide security for a forward and backward movement, means acting in both directions are required. It is often not feasible to provide an additional yoke for reasons of space. It is also usually very complicated to ensure all-around protection for moving parts.

OBJECT AND SUMMARY OF THE INVENTION

It is the primary object of the invention to generate a switching signal at every point of a through-opening when an obstacle is located between the moving object and the edge of the through-opening, regardless of the movement direction of the object and the geometrical construction of the through-opening.

This object is met through a safety device for a moving system with a drive in which a pneumatically operated piston, by linear movement in a cylinder, moves a transported object past a stationary part in at least one direction. According to the invention, the cylinder has, at its ends, devices for measuring the pressure of the air flowing out of the cylinder in the movement direction of the piston, wherein a drop in the otherwise substantially constant pressure below a threshold value serves as a switching signal at least for switching off the system.

Additional devices for measuring pressure by which at least one additional threshold value can be adjusted or which permit analog monitoring of pressure can advantageously be provided.

Further, it is possible to combine the measurement of pressure with a measurement of the spatial position and/or the velocity of the moving system.

Valves with either a closed or open center position can be used for supplying compressed air.

The solution to the above-stated problem has further advantages consisting in that no additional mechanical parts such as yokes, frames, switching strips, sensor arrangements or receiver arrangements are required at the edges of the opening. The switching signal is generated during inward and outward movement without additional mechanical means when an object arrives between the moving system and the boundary of the opening. Accordingly, the solution is executed in a simple and economical manner.

The adjustment of the safety device can vary within a wide range (adjustment of force). The evaluation of-the measured pressure can be carried out by means of a simple switch-point evaluation or by analog area evaluation.

In combination with a path measurement system, different force adjustments, e.g., to the travel area at points of various hazards, can be adjusted, selected and evaluated.

Depending on the pressure measuring device, the switching signal can act directly to switch off the drive, or evaluation is carried out first via electronics or a control unit. Accordingly, it is possible not only to switch off the drive but also to carry out a reversal of the direction of movement in connection with hardware and software.

The invention will be explained more fully in the following with reference to the schematic drawing.

DESCRIPTION OF THE PREFERRED EMBODIMENTS

Figure 1:
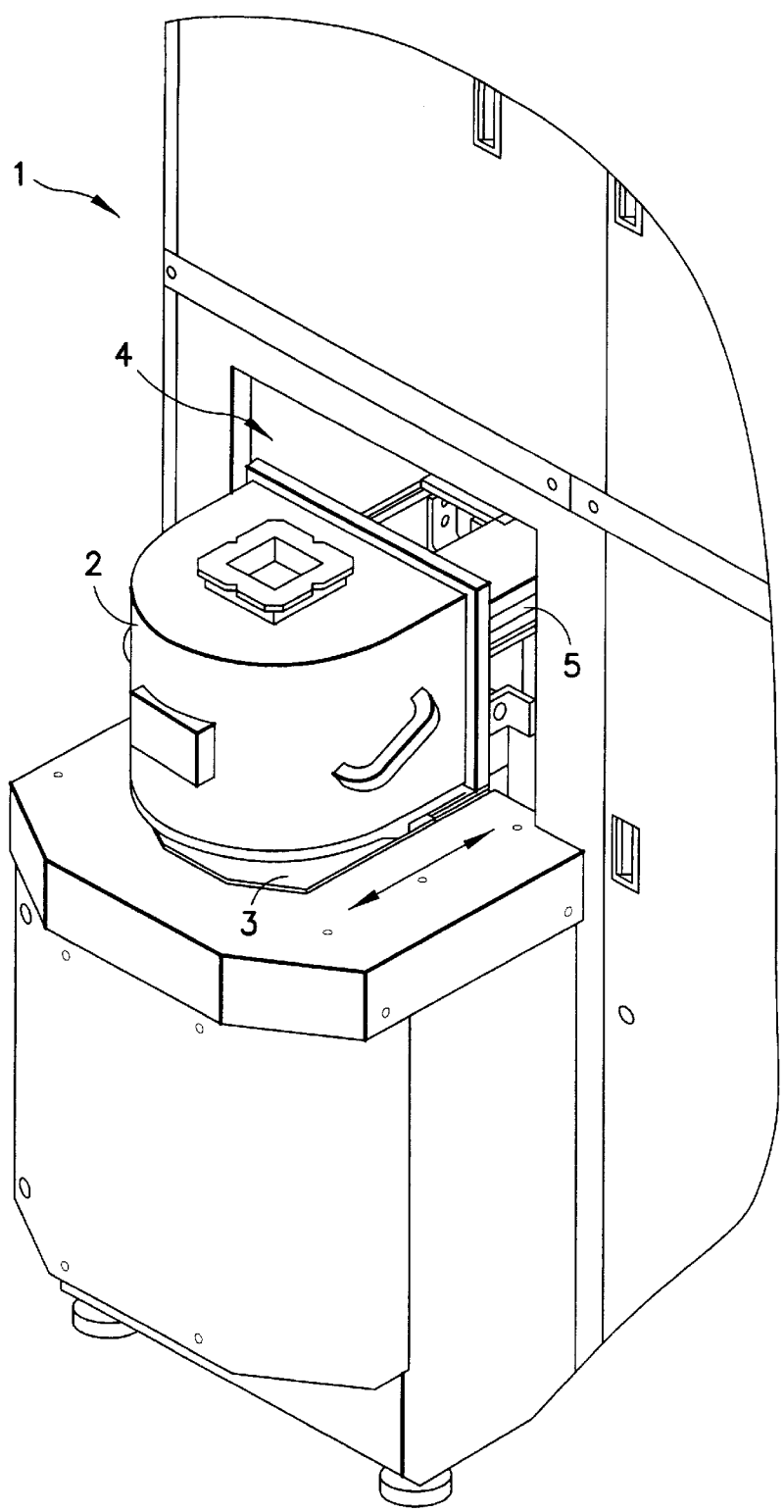
FIG. 1 shows a lock for loading and unloading a station prior to loading with a transport container.
Figure 2:
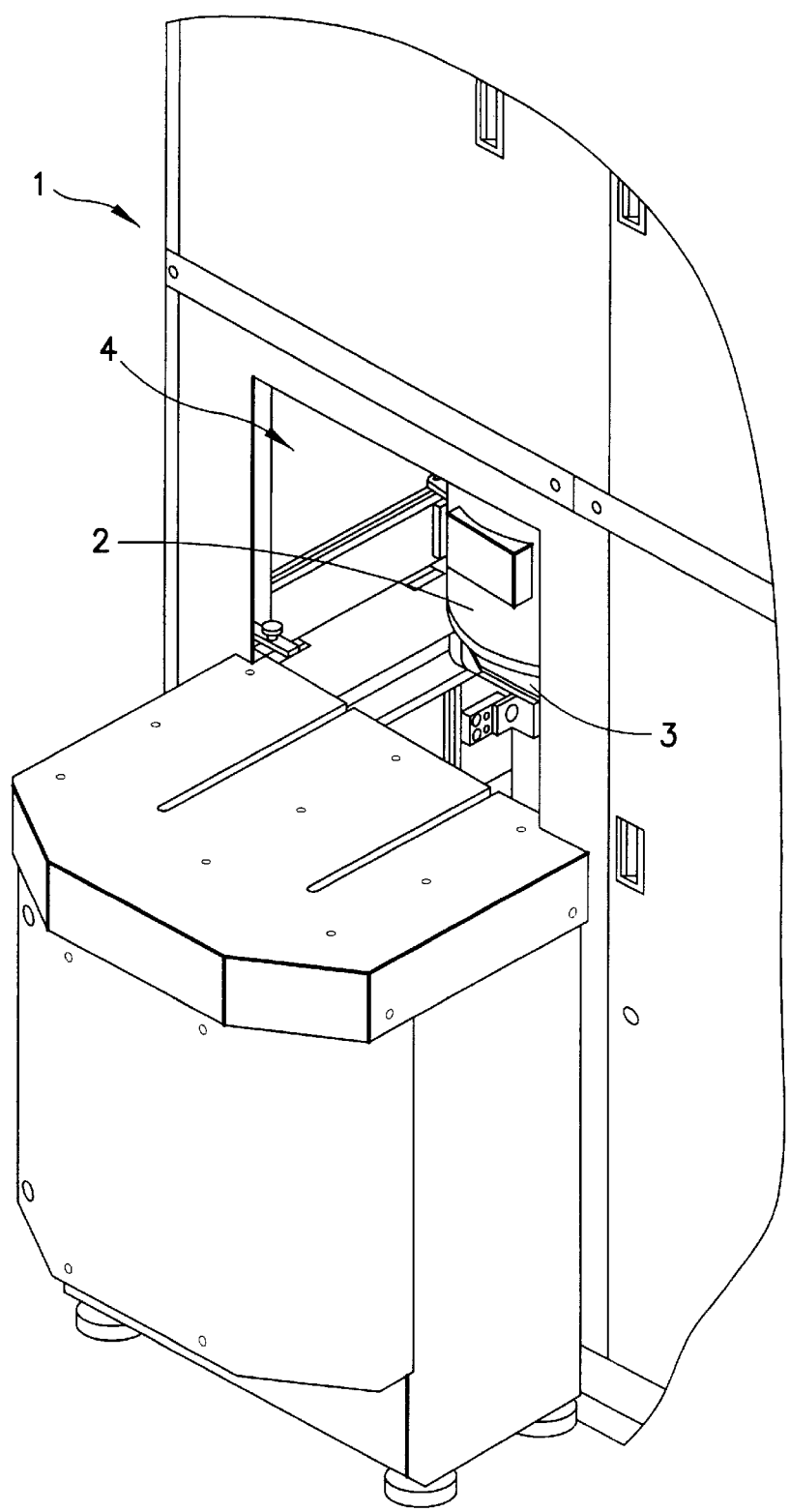
FIG. 2 shows the lock according to FIG. 1 after loading.

In order to load and unload a station 1 in the semiconductor machining process, a transport container 2 according to FIG. 1 can be deposited on a platform provided with alignment means in front of a lock 4. The lock 4 has a window, not shown, for closing. A pneumatic linear drive 5 serves to displace the platform 3 in the direction indicated by the arrow, so that the transport container 2 can be transported into and out of the station 1.

Figure 3:
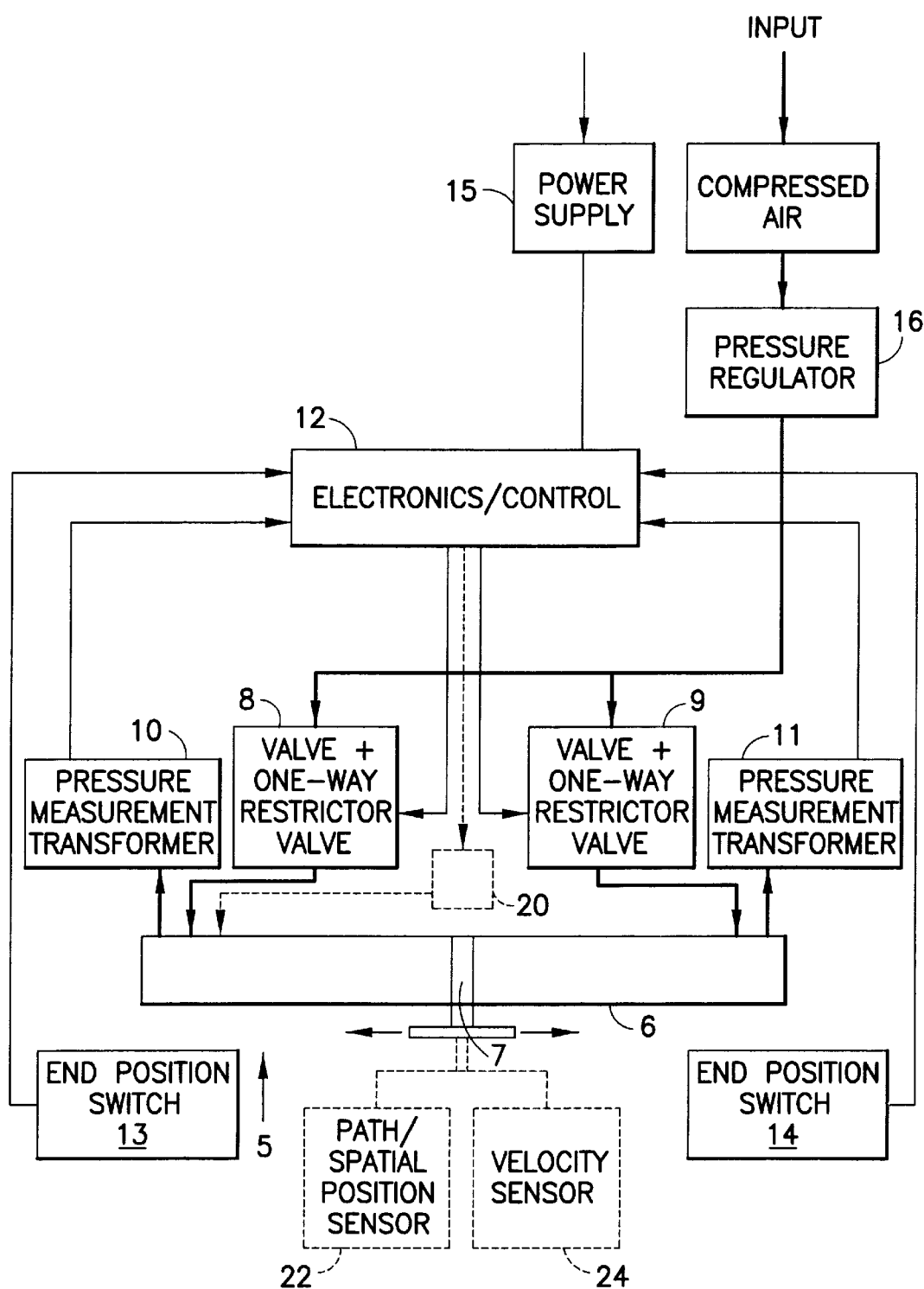
FIG. 3 is a block diagram showing an arrangement for generating a switching signal.

If obstacles occur during the transporting process between the edge of the lock 4 and the moving system of the platform 3 and of the received transport container 2, the change in pressure acting on the system at least causes the movement to e switched off. For this purpose, the pneumatic line r drive 5 is outfitted with a safety device according to FIG. 3. For the operation of the linear drive 5, including cylinder 6 and piston 7, the cylinder 6 has, in its end regions, inlet and outlet lines provided with valves and one-way restrictor valves 8 and 9 for compressed air for adjusting the movement direction and velocity. For safety reasons, pressure sensors in the form of pressure switches or pressure-measurement transformers 10, 11 make it possible to measure the pressure of the air flowing out of the cylinder 6 on one side during the movement of the piston 7 driven by the compressed air supplied from the other side. Connections lead from the pressure-measurement transformers 10, 11 to electronics or a control unit 12 into which signals are conveyed from end position switches 13, 14 and which is fed by a power supply 15. A pressure regulator 16 provides the valves and one-way restrictor valves 8, 9 with the required compressed air. End position damping means contained in the linear drive are not shown in FIG. 3.

The position of the linear drive 5 can be determined by means of the end position switches 13, 14 after switching on again. If an emergency shutdown takes place and no end position location can be determined, a predetermined movement procedure is worked out by the electronics or control unit 12. It is particularly important that the end position switches 13, 14 are arranged far enough from the actual end of the cylinder 6 that the pressure dropping at the ends of the cylinder does not cause a shutdown of the system before the end position is signaled.

When an object enters the transport region, a change in the otherwise constant pressure ratios in the cylinder 6 is brought about when the moving system runs against this object. The reduction in pressure is detected in that the pressure-measurement transformer 10, 11 forward of the piston in the movement direction of the piston measures the pressure of the air flowing out. A threshold value for pressure is set for each movement direction in order for the pressure-measurement transformer 10 or 11 to generate a switching signal. If the measured pressure falls below the respective threshold value, the corresponding switching signal, after being electronically processed in the electronics/control unit 12, initiates a software-controlled halting of the system by switching the valve and one-way restrictor valve 8 or 9 responsible for forward driving. Subsequently, the movement of the system is reversed by the electronics/control unit 12 until the initial position is reached. The object which is temporarily clamped with marginal force between the lock wall and the system is released again. When the system is moved back through activation of the safety circuit, the status is read out at the control computer, not shown. After the obstacle is removed, the system can be transported in the desired direction by command repetition.

With respect to setting the threshold value, it must be ensured that effects which are brought about by transported alternating loads or rough running in the guide system and the velocity of the piston which accordingly act on the pressure of the outflowing air do not influence the generation of the switching signal.

The pressure regulator 16 which can limit the force of the cylinder 6 ensures the maintenance of the adjusted air pressure required for generating movement. The forces acting on the object until the movement direction is switched can be kept low through adjustment of the threshold value for the pressure of the air flowing out.

For safety reasons, e.g., switching on the device again after the emergency shutdown, maintaining determined positions for a definite period of time by switching or connecting the two chambers of the cylinder 6 after emergency shutdown, it is advantageous to use valves of the closed-center-position type and one-way restrictor valves 8, 9 as in the present embodiment example,.

A further embodiment example can be modified in such a way that center-position-open valves are used. When the threshold value is reached, these valves switch over and deaerate both chambers of the cylinder 6. In the pressureless state of cylinder 6, it is possible to move the piston 7 manually.

The use of an additional pressure-measurement transformer allows operation in two pressure areas with a corresponding quantity of threshold values. An additional pressure-measurement transformer 20 can also be used for constant analog monitoring of the pressures in the chambers of the cylinder 6 by means of appropriate evaluating electronics and for use of the pressures to control the linear drive 5 by means of the valves and one-way restrictor valves 8, 9 after evaluation of the measurement results, such as allowing at least one additional threshold value to be adjusted. This enables reaction to even smaller changes in pressure and accordingly a further reduction of the occurring residual force.

Pressure measurement can incorporate a path measurement system 22 for the purpose of deliberate monitoring of determined movement areas of the system. The pressure is measured and evaluated depending on the current location through which the piston 7 passes. Therefore, specifically determined movement areas can be monitored in particular and safety is further increased. Areas of no relevance with respect to technical safety concerns could be masked or faded out, for example, or changes could be made in the operating procedure.

The monitoring of pressure in connection with evaluation of velocity, such as with velocity sensor 24, makes it possible to monitor safety areas at high piston velocities.

While the foregoing description and drawings represent the preferred embodiments of the present invention, it will be obvious to those skilled in the art that various changes and modifications may be made therein without departing from the true spirit and scope of the present invention.

What is claimed is:

1. A semiconductor transport container loading and unloading station safety device comprising:
    a cylinder;
    a pneumatically operated piston operating by linear movement in said cylinder, the piston being connected to a semiconductor transport container support for moving a semiconductor transport container past a stationary part of a loading and unloading station in at least one direction; devices operably connected to ends of the cylinder for measuring the pressure of air flowing out of the cylinder in a movement direction of the piston, so that a drop in an otherwise substantially constant pressure below a threshold value serves as a switching signal;
    end stops adapted to stop motion of the support at the end of the motion of the support;
    end position sensors for sensing end positions before the support reaches the end stops;
    a controller adapted to reverse or stop motion of the support upon receipt of the switching signal, the controller further adapted to ignore the switching signal when the end position is sensed; and
    at least one additional device for measuring pressure.

2. The device according to claim 1, wherein said at least one additional device for measuring pressure permits analog monitoring of pressure.

3. The device according to claim 1, wherein said at least one additional device for measuring pressure allows at least one additional threshold value.

4. The device according to claim 3, wherein the measurement of pressure is combined with a measurement of the spatial position of a moving system.

5. The device according to claim 4, wherein the measurement of pressure is combined with a measurement of the velocity of the moving system.

6. The device according to claim 5, wherein valves with a closed center position are used for supplying compressed air.

7. The device according to claim 6, wherein valves with open center position are used for supplying compressed air.

8. A semiconductor transport container load and unload station comprising:

a lock;

a substrate transport container support platform movable into and out of the lock;

end stops adapted to stop motion of the support platform at the end of the motion of the support platform;

end position sensors for sensing end positions before the support platform reaches the end stops;

a controller adapted to reverse or stop motion of the support platform upon receipt of a switching signal, the controller further adapted to ignore the switching signal when the end position is sensed; and a drive connected to the support platform for moving the support platform into and out of the lock, the drive comprising a cylinder, a pneumatically operated piston movably mounted in the cylinder, and at least one pressure sensor for sensing pressure of air flowing out of the cylinder; where the switching signal is generated based on the sensed pressure.

9. A method of stopping movement of a substrate transport container support platform in a semiconductor transport container load and unload station comprising the steps of:

sensing by a sensor pressure of air flowing out of a pneumatic drive cylinder of a drive connected to the support platform;

sending a pressure signal from the sensor to a controller, the controller generating a switching signal when the pressure signal matches or is less than a predetermined signal valve, the controller adapted to stop a supply of air to a first inlet of the cylinder, to reverse or stop motion of the support platform upon generation of the switching signal, the controller further adapted to ignore the switching signal when an end position is sensed.

10. A method of stopping and reversing movement of a substrate transport container support platform in a semiconductor transport container load and unload station comprising the steps of:

stopping movement of said support platform as recited in claim 9;

reversing movement of said support platform by supplying air into a second inlet of said cylinder.

* * * * *